US012753979B2

(12) United States Patent
Wu et al.

(10) Patent No.: US 12,753,979 B2
(45) Date of Patent: Oct. 6, 2026

(54) CONNECTOR, CONNECTOR ASSEMBLY, LIQUID COOLED PLATE, AND LIQUID COOLED SERVER

(71) Applicant: BITMAIN TECHNOLOGIES INC., Beijing (CN)

(72) Inventors: Chao Wu, Beijing (CN); Jianjun Shu, Beijing (CN); Manhao Liang, Beijing (CN); Zhaodi Zhou, Beijing (CN); Wenhai Wang, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 254 days.

(21) Appl. No.: 18/440,699

(22) Filed: Feb. 13, 2024

(65) Prior Publication Data

US 2024/0183627 A1 Jun. 6, 2024

Related U.S. Application Data

(63) Continuation of application No. PCT/CN2022/112246, filed on Aug. 12, 2022.

(30) Foreign Application Priority Data

Aug. 19, 2021 (CN) ......................... 202121959800.8

(51) Int. Cl.
*F28F 9/02* (2006.01)
*F16K 15/18* (2006.01)
*H05K 7/20* (2006.01)

(52) U.S. Cl.
CPC .......... *F28F 9/0282* (2013.01); *F28F 9/0256* (2013.01); *H05K 7/20772* (2013.01); *F16K 15/1843* (2021.08)

(58) Field of Classification Search
CPC ............... F16K 1/14; F16K 15/04–048; F16K 15/1843; Y10T 137/791; Y10T 137/7911;
(Continued)

(56) References Cited

U.S. PATENT DOCUMENTS

| | | | | | |
|---|---|---|---|---|---|
| 7,792 | A * | 11/1850 | Jarecki | B21G 3/32 | 144/129 |
| 816,245 | A * | 3/1906 | Elroy | F16K 15/04 | 137/519.5 |

(Continued)

FOREIGN PATENT DOCUMENTS

| | | |
|---|---|---|
| CN | 204062265 U | 12/2014 |
| CN | 208331517 U | 1/2019 |

(Continued)

OTHER PUBLICATIONS

International Search Report dated Nov. 4, 2022 for International Application No. PCT/CN2022/112246.

(Continued)

*Primary Examiner* — Craig J Price

(57) ABSTRACT

A connector, a connector assembly, a liquid cooled plate, and a liquid cooled server, where the connector includes a first connector body, a ball body, and a mesh baffle, where an annular protrusion part is provided inside the first connector body and forms an annular through-hole, and the ball body is disposed in a hollow inner cavity and is limited by the annular protrusion part and the mesh baffle; when fluid enters from a first inlet, the ball body is away from the annular through-hole to form an opened passage, and when the fluid enters from a first outlet, the ball body blocks the annular through-hole to form a closed passage. The connector assembly includes a first connector and a second connector, the first connector adopts the connector above, the
(Continued)

second connector includes a cut elastic retaining ring for dividing the elastic retaining ring into a plurality of blades.

19 Claims, 7 Drawing Sheets

(58) Field of Classification Search
CPC ......... Y10T 137/7912; Y10T 137/7927; Y10T 137/7928; F16L 15/00; F28D 2021/0029; F28F 9/0282; F28F 9/0256
USPC ...... 137/533.11, 533.13, 533.15, 539, 539.5, 137/613–614.6, 798, 519.5; 251/149–149.9
See application file for complete search history.

(56) References Cited

U.S. PATENT DOCUMENTS 954,178 A * 4/1910 Fowler .................... F16K 29/00 137/515
1,279,599 A * 9/1918 Slaughter, Jr. .......... F16K 15/04 137/533.15
1,490,848 A * 4/1924 Pettit ....................... F16N 21/02 184/89
1,960,335 A * 5/1934 Finnie ..................... F16K 15/04 210/136
2,896,663 A * 7/1959 Mena .................... F16K 15/044 137/550
2,999,499 A * 9/1961 Willet ................... A61M 39/24 604/83
3,766,940 A * 10/1973 Mason .................... F16K 17/24 137/460
4,030,520 A * 6/1977 Sands ................... F16K 15/048 137/513.5
4,246,002 A * 1/1981 Bell ...................... F23D 14/825 137/533.15
4,542,945 A * 9/1985 Berisch ................... B60T 8/285 303/9.67
4,590,962 A * 5/1986 Tespa ...................... F16K 17/30 137/460
4,646,783 A * 3/1987 Bazan ..................... F16K 15/04 137/515
4,681,138 A * 7/1987 Giuliani ................ F16K 15/063 137/538
5,086,613 A * 2/1992 Fox ........................ A01D 57/20 56/11.9
5,799,504 A * 9/1998 Nelson .................. F25B 43/003 62/509
5,967,180 A * 10/1999 Yates, III .............. F16K 15/044 137/533.19
6,508,269 B2 * 1/2003 Szabo ................... F16L 37/407 137/515.5
6,615,760 B1 * 9/2003 Wise ....................... F16K 15/04 114/197
7,540,304 B2 * 6/2009 Cornwell .............. F16K 15/021 137/903
9,110,475 B2 * 8/2015 Simpson ............. F16K 31/1635
10,661,029 B2 * 5/2020 Robertson ........... A61M 5/1424
2004/0094470 A1 * 5/2004 Jackson ............... B01D 29/114 210/411
2009/0223574 A1 * 9/2009 Montague ............. F16K 15/048 137/519.5

FOREIGN PATENT DOCUMENTS

| | | | |
|---|---|---|---|
| CN | 213064759 | U | 4/2021 |
| CN | 215928691 | U | 3/2022 |
| JP | H0625675 | U | 4/1994 |
| WO | WO2020005198 | A1 | 1/2020 |

OTHER PUBLICATIONS

Notice of Registration Procedures dated Feb. 7, 2022 for Chinese Application No. 2021219598008.

* cited by examiner

CONNECTOR, CONNECTOR ASSEMBLY, LIQUID COOLED PLATE, AND LIQUID COOLED SERVER

CROSS-REFERENCE TO RELATED APPLICATIONS

This application is a continuation of International Application No. PCT/CN2022/112246, filed on Aug. 12, 2022, which claims priority to Chinese Patent Application No. 202121959800.8, filed on Aug. 19, 2021. The disclosures of the aforementioned applications are hereby incorporated by reference in their entireties.

TECHNICAL FIELD

The present disclosure relates to the field of liquid cooled servers, and in particular, to a connector, a connector assembly, a liquid cooled plate and a liquid cooled server.

BACKGROUND

During the installation and disassembly process of a current water-cooled mining machine, due to an existence of a certain water pressure at a water inlet and a water outlet on the waterway, if an operation is improper, for example, a water valve is not closed in advance or the water valve is not closed tightly, water at the water inlet and the water outlet will splash outward, which may bring a certain risk to other circuits or mining machines in a place where mining machines are densely arranged. Therefore, it is necessary to design a pipe connector that can be used to prevent splashing at the water inlet and the water outlet when the pipe connector is in a disconnected state.

SUMMARY

A first object of the present application is to provide a connector, which aims to solve a technical problem of splashing due to water flowing back in a connector when the connector is disconnected.

In order to achieve the above object, a solution provided by the present application is: a connector, including a first connector body, a ball body and a mesh baffle, where the first connector body is provided with a hollow inner cavity, a first inlet disposed at one end of the hollow inner cavity, and a first outlet disposed at the other end of the hollow inner cavity; the mesh baffle is disposed in the hollow inner cavity, and the mesh baffle is provided with a plurality of first flowing through-holes, an annular protrusion part located between the first inlet and the mesh baffle is provided inside the hollow inner cavity, the annular protrusion part is enclosed to form an annular through-hole, a diameter of the annular through-hole and a diameter of the first flowing through-hole are both smaller than a diameter of the ball body; and the ball body is disposed between the annular protrusion part and the mesh baffle.

In an implementation, the first connector body includes a first pipe body and a second pipe body connected to the first pipe body; the second pipe body includes a connection part and a thimble part, one end of the connection part is connected to an end of the first pipe body away from the mesh baffle, and the other end of the connection part is connected to the thimble part, the thimble part is configured to be inserted into a second connector and open an elastic retaining ring of the second connector; the first inlet is disposed at an end of the first pipe body close to the second pipe body, and the first outlet is disposed at an end of the first pipe body away from the second pipe body.

In an implementation, the connection part includes a first connection part and a second connection part, the first connection part is connected to the end of the first pipe body away from the mesh baffle, and the second connection part is configured to connect the first connection part and the thimble part.

In an implementation, the second connection part is in a cone-shape, and the second connection part comprises a first end part connected to the first connection part, a second end part connected to the thimble part and having a diameter smaller than a diameter of the first end part, and a cone-shape side part for connecting the first end part to the second end part, where at least one second flowing through-hole for fluid passing therethrough runs through the cone-shape side part.

In an implementation, the end of the first pipe body away from the second pipe body is provided with a first notch for installing the mesh baffle.

In an implementation, the first pipe body and the second pipe body are connected in at least one manner of welding, bonding or threaded connection.

A second object of the present application is to provide a connector assembly, including:

- a first connector that adopts the above-mentioned connector;
- a second connector including a third pipe body and an elastic retaining ring installed in the third pipe body, where the elastic retaining ring is provided with a plurality of cutouts spaced circumferentially for dividing the elastic retaining ring into a plurality of blades, an end of the first connector away from the mesh baffle is detachably connected to the second connector, and when the first connector is connected to the second connector, the thimble part is inserted into the third pipe body and opens the elastic retaining ring to communicate the first connector with the second connector; when the first connector is disconnected to the second connector, the elastic retaining ring in the third pipe body is closed to block the first connector from the second connector.

In an implementation, the connector assembly further includes a union nut, and the union nut is configured to detachably connect the first connector and the second connector.

In an implementation, the third pipe body is provided with a second notch for installing the elastic retaining ring.

A third object of the present application is to provide a liquid cooled plate, including: a liquid cooled plate body and at least one above-mentioned connector assembly connected to the liquid cooled plate body.

A fourth object of the present application is to provide a liquid cooled server, including: a circuit board and the above-mentioned liquid cooled plate, where the liquid cooled plate is thermally conductively connected to the circuit board.

Compared with the existing technology, the beneficial effects of the present application are as below.

The first object of the present application provides a connector, the connector includes a first connector body, a ball body and a mesh baffle, where the first connector body is provided with a hollow inner cavity, the mesh baffle is provided with a plurality of first flowing through-holes, an annular protrusion part is provided inside the hollow inner cavity, the annular protrusion part forms an annular through-hole, and a diameter of the annular through-hole and a diameter of the first through-hole are both smaller than a diameter of the ball body, the ball body is disposed in the hollow inner cavity and is limited by the annular protrusion part and the mesh baffle, and when fluid enters from a first inlet, the ball body is away from the annular through-hole under an action of a fluid pressure in a pipe wall of the first connector body to form an opened passage; and when the fluid enters from an end close to the mesh baffle, the ball body blocks the annular through-hole under the action of the fluid pressure in the pipe wall of the first connector body, thereby preventing splashing due to the fluid flowing back out of the water inlet when the connector is disconnected.

The second object of the present application provides a connector assembly, the connector assembly includes a first connector and a second connector, where the first connector adopts the above-mentioned connector, and the second connector includes an elastic retaining ring, the elastic retaining ring is provided with a plurality of cutouts spaced circumferentially for dividing the elastic retaining ring into a plurality of blades, and when the first connector is connected to the second connector, the thimble part is inserted into the third pipe body and opens the elastic retaining ring to connect the first connector to the second connector; and when the first connector is disconnected to the second connector, the elastic retaining ring is closed to block the first connector from the second connector, thereby ensuring that when the first connector is disconnected from the second connector, the fluid at both the first connector and the second connector will not splash.

BRIEF DESCRIPTION OF DRAWINGS

To describe the technical solutions in embodiments of the present disclosure or related technologies more clearly, the following briefly introduces the accompanying drawings needed for describing the embodiments or the related technologies. Apparently, the accompanying drawings in the following description are only some embodiments of the present application, and persons of ordinary skill in the art may still derive other drawings from these accompanying drawings without creative effort.

DESCRIPTION OF REFERENCE NUMBERS

Figure 1:
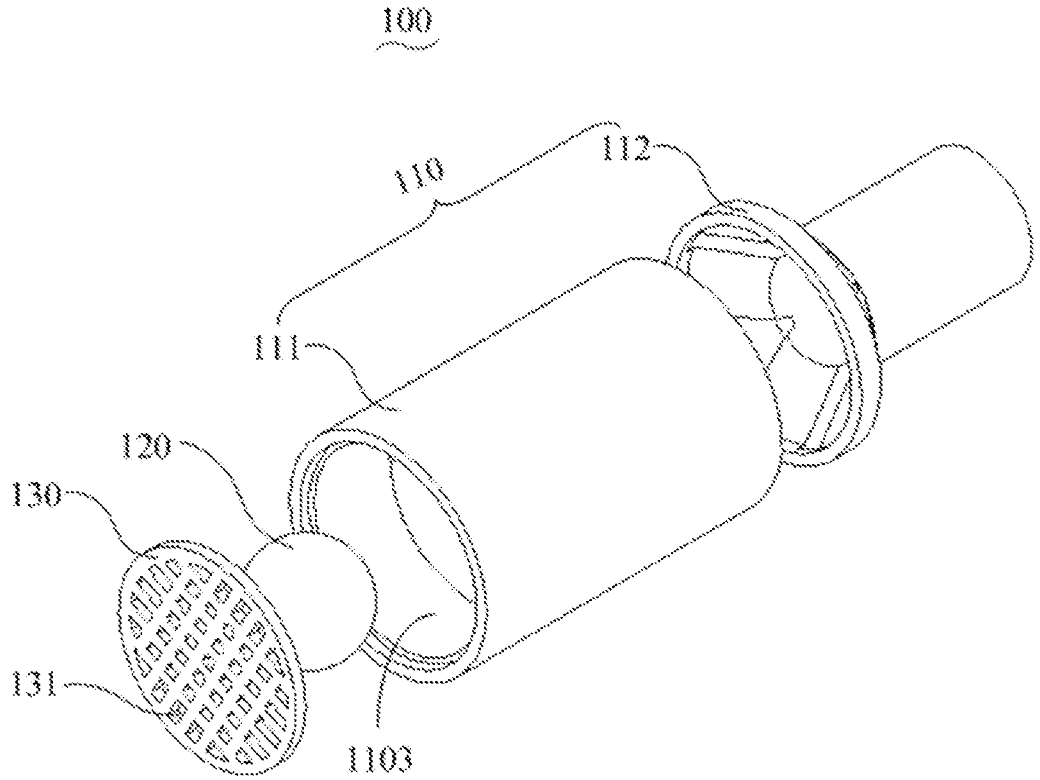
FIG. 1 is an exploded view of a connector provided by an embodiment of the present application.

100. connector; 110. first connector body; 1101. hollow inner cavity; 1102. first inlet; 1103. first outlet; 1104. annular protrusion part; 111. first pipe body; 1111. first notch; 1112. annular through-hole; 112. second pipe body; 1121. connection part; 1105. first connection part; 1106. second connection part; 1107. first end part; 1108. second end part; 1109. cone-shape side part; 1110. second flowing through-hole; 1122. thimble part; 120. ball body; 130. mesh baffle; 131. first flowing through-hole; 200. connector assembly; 210. first connector; 220. second connector; 221. third pipe body; 2211. second notch; 222, elastic retaining ring; 230. union nut; 300. liquid cooled plate; 310. liquid cooled plate body; 311. water inlet; 312. water outlet; 320. water inlet pipe; 330. water outlet pipe; 340. first connector assembly; 350. second connector assembly; 400. liquid cooled server; 410. circuit board.

DESCRIPTION OF EMBODIMENTS

The technical solutions in the embodiments of the present application will be clearly and completely described below with reference to the accompanying drawings in the embodiments of the present application. Obviously, the described embodiments are only some of the embodiments of the present application, rather than all of the embodiments. Based on the embodiments in the present application, all other embodiments obtained by persons of ordinary skill in the art without creative efforts fall within the scope of protection of the present application.

It should be noted that all directional indications (such as up, down, left, right, front, back, . . . ) in the embodiments of the present application are only used to explain, for example, a relative positional relationship and a movement condition between components in a specific posture, and if the specific posture is changed, the directional indication is also changed accordingly.

It should also be noted that when an element is referred to as being “mounted on” or “disposed on “another element”, it can be directly on another element or there may be an intervening component present therebetween. When an element is referred to be “connected” to another element, it can be directly connected to another element or indirectly connected to another element through the intervening element.

In addition, descriptions related to “first”, “second”, etc. in the present application are only for descriptive purposes and cannot be understood as indicating or implying their relative importance or implicitly indicating the number of indicated technical features. Therefore, features defined as “first”, “second” may explicitly or implicitly include at least one such feature. In addition, the technical solutions in various embodiments can be combined with each other, but it must be based on the fact that they can be realized by persons of ordinary skill in the art. When a combination of technical solutions is contradictory or cannot be realized, it should be considered that such combination of technical solutions does not exist, nor is it within the scope of protection of the present application.

As shown in FIGS. 1-4, a connector 100 provided by an embodiment of the present application includes a first connector body 110, a ball body 120 and a mesh baffle 130. The first connector body 110 is provided with a hollow inner cavity 1101, a first inlet 1102 disposed at one end of the hollow inner cavity 1101, a first outlet 1103 disposed at the other end thereof, the mesh baffle 130 is disposed in the hollow inner cavity 1101, and the mesh baffle 130 is provided with a plurality of first flowing through-holes 131, an annular protrusion part 1104 located between the first inlet 1102 and the mesh baffle 130 is provided inside the hollow inner cavity 1101, the annular protrusion part 1104 is enclosed to form an annular through-hole 1112, a diameter of the annular through-hole 1112 and a diameter of the first flowing through-hole 131 are both smaller than a diameter of the ball body 120, and the ball body 120 is disposed between the annular protrusion part 1104 and the mesh baffle 130.

The mesh baffle 130 is in a circular shape and is installed in the hollow inner cavity 1101 of the first connector body 110, the mesh baffle 130 is provided with the plurality of first flowing through-holes 131, and the diameter of the first flowing through-hole 131 is smaller than the diameter of the ball body 120, such a structure can limit the ball body 120 without hindering flowing of fluid in the first connector body 110; in addition, the mesh baffle 130 can filter impurities in a pipeline. The annular protrusion part 1104 formed in the hollow inner cavity 1101 is annularly formed along a pipe wall of the first connector body 110 and enclosed to form the annular through-hole 1112, and the diameter of the annular through-hole 1112 is smaller than the diameter of the ball body 120, such a structure can limit the ball body 120 without hindering the fluid circulation in a first pipe body 111. A structure formed by the first connector body 110, the ball body 120 and the mesh baffle 130 together and a principle of the structure are similar to a one-way valve, which can achieve an effect that the fluid can only flow in one direction. In addition, it should be noted that the first pipe body 111 can be processed by injection molding.

As shown in FIG. 1, FIG. 2 and FIGS. 4-6, as an embodiment, the first connector body 110 includes the first pipe body 111 and a second pipe body 112 connected to the first pipe body 111; the second pipe body 112 includes a connection part 1121 and a thimble part 1122, one end of the connection part 1121 is connected to an end of the first pipe body 111 away from the mesh baffle 130, the other end of the connection part 1121 is connected to the thimble part 1122, the thimble part 1122 is configured to be inserted into a second connector 220 and open an elastic retaining ring 222 of the second connector 220; the first inlet 1102 is disposed at an end of the first pipe body 111 close to the second pipe body 112, and the first outlet 1103 is disposed at an end of the first pipe body 111 away from the second pipe body 112. The second pipe body 112 is provided to cooperate with the second connector 220 to enable the fluid to circulate in the pipeline. It should be noted that the thimble part 1122 and the connection part 1121 are both provided with a passage connected with the pipe wall of the first pipe body 111 for fluid flowing.

As shown in FIG. 1 and FIGS. 4-6, as an embodiment, the connection part 1121 includes a first connection part 1105 and a second connection part 1106, the first connection part 1105 is connected to an end of the first pipe body 111 away from the mesh baffle 130, and the second connection part 1106 is configured to connect the first connection part 1105 with the thimble part 1122. A diameter of the thimble part 1122 provided in this embodiment is smaller than a diameter of the first connection part 1105, with a purpose of enabling the thimble part 1122 to be inserted into a pipe wall of the second connector 220 and open the elastic retaining ring 222 in the second connector 220, so as to allow the pipe to form a passage. The first connection part 1105 is a part connected to the first pipe body 111, and the second connection part 1106 is to connect the first connection part 1105 with the thimble part 1122.

Figure 4:
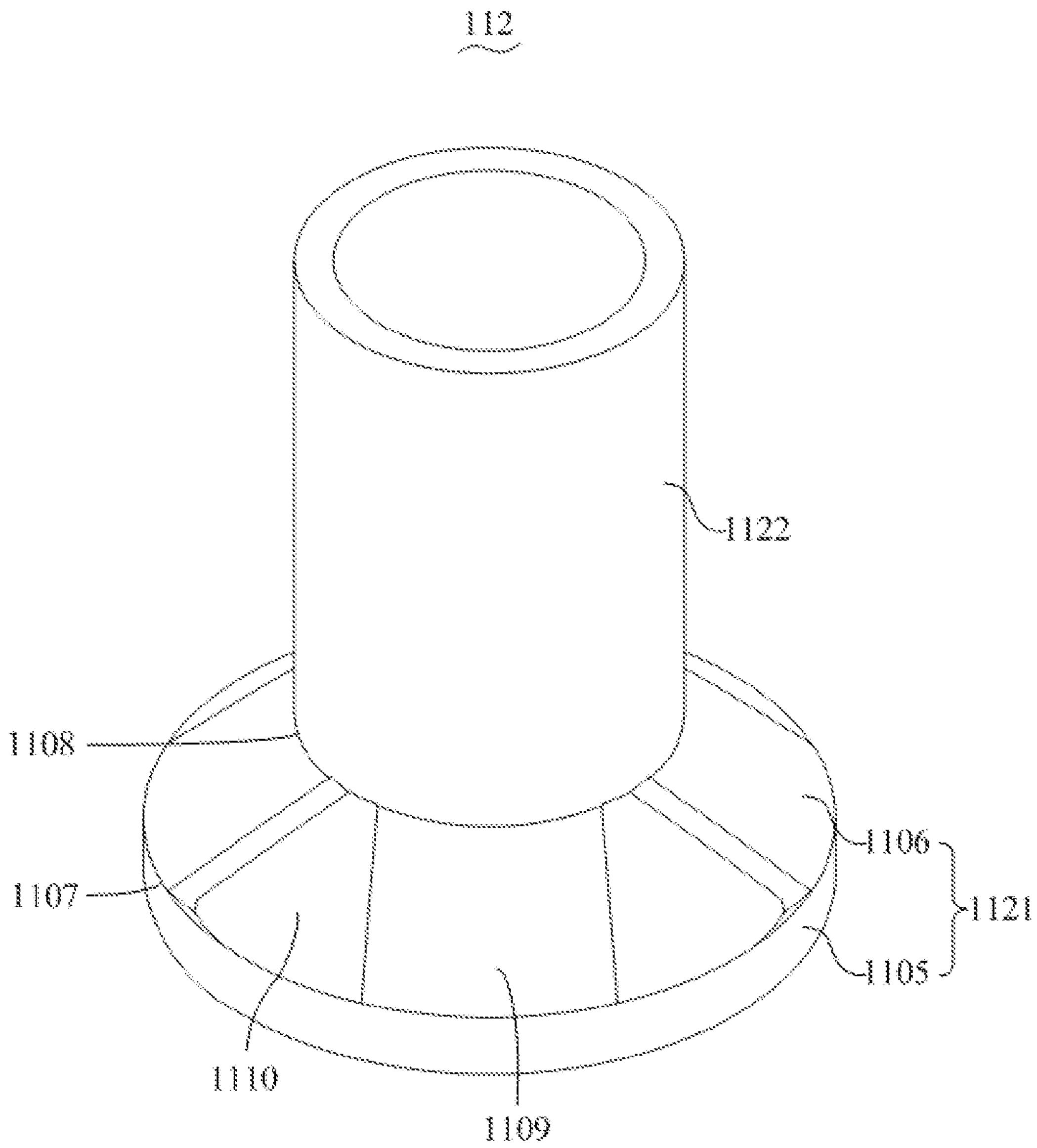
FIG. 4 is a perspective schematic view of a second pipe body provided by an embodiment of the present application.

As shown in FIG. 1 and FIG. 4, as an embodiment, the second connection part 1106 is in a cone-shape, and the second connection part 1106 includes a first end part 1107 connected to the first connection part 1105, a second end part 1108 connected to the thimble part 1122 and having a diameter smaller than a diameter of the first end part 1107, and a cone-shape side part 1109 for connecting the first end part 1107 to the second end part 1108, where at least one second flowing through-hole 1110 for fluid passing therethrough runs through the cone-shape side part 1109 thereon. It should be noted that the fluid in the second pipe body 112 can pass through the passage of the thimble part 1122 and the second flowing through-hole 1110 of the second connection part 1106 at the same time. The second flowing through-hole 1110 provided in the second connection part 1106 is in order to increase the flow rate of the fluid per unit time. The second connection part 1106 provided as cone-shape is a transitional connecting part designed based on the premise that the diameter of the thimble part 1122 is smaller than the diameter of the first connection part 1105.

Figure 3:
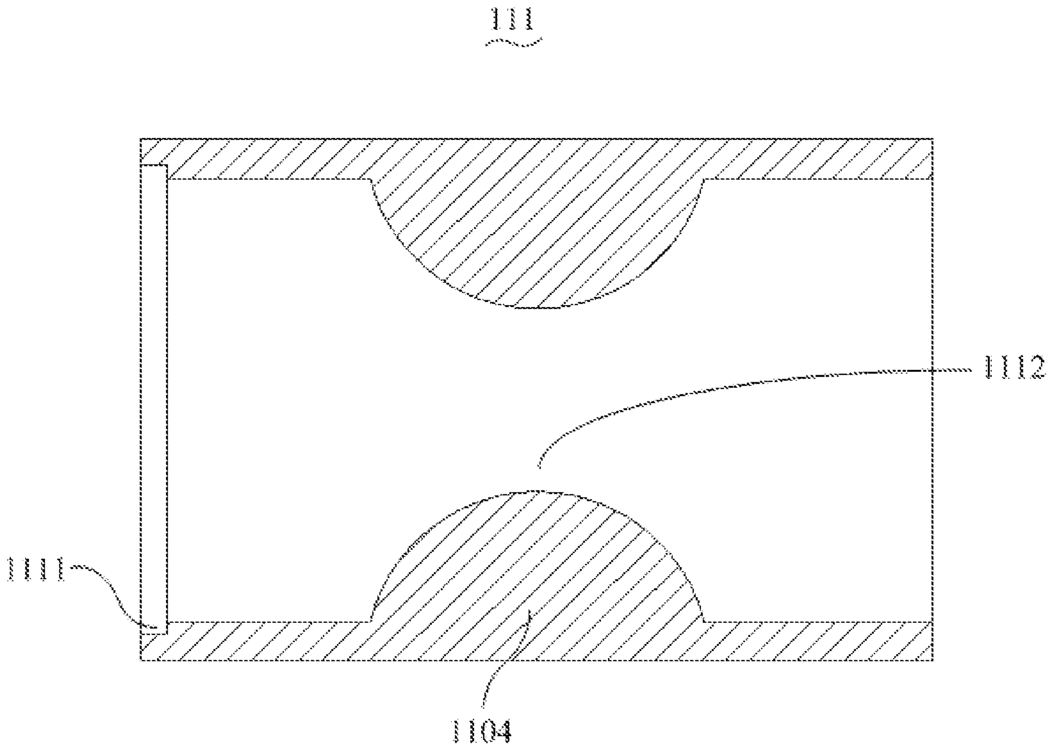
FIG. 3 is a cross-sectional view of a first pipe body provided by an embodiment of the present application.

As shown in FIGS. 1 and 3, as an embodiment, an end of the first pipe body 111 away from the second pipe body 112 is provided with a first notch 1111 for installing the mesh baffle 130. The first notch 1111 is provided on an end surface of the first pipe body 111 away from the second pipe body 112 and is annular along the pipe wall of the first pipe body 111, and a diameter of the first notch 1111 is slightly larger than the diameter of the mesh baffle 130 to enable the mesh baffle 130 to be placed in the first notch 1111. In this embodiment, the mesh baffle 130 is connected to the first notch 1111 through welding. A welded structure has high rigidity and simple and convenient operation, and thus the welding is used. Of course, in specific applications, it is not limited to only welding, for example, as an alternative, bonding can be used for connection.

Figure 2:
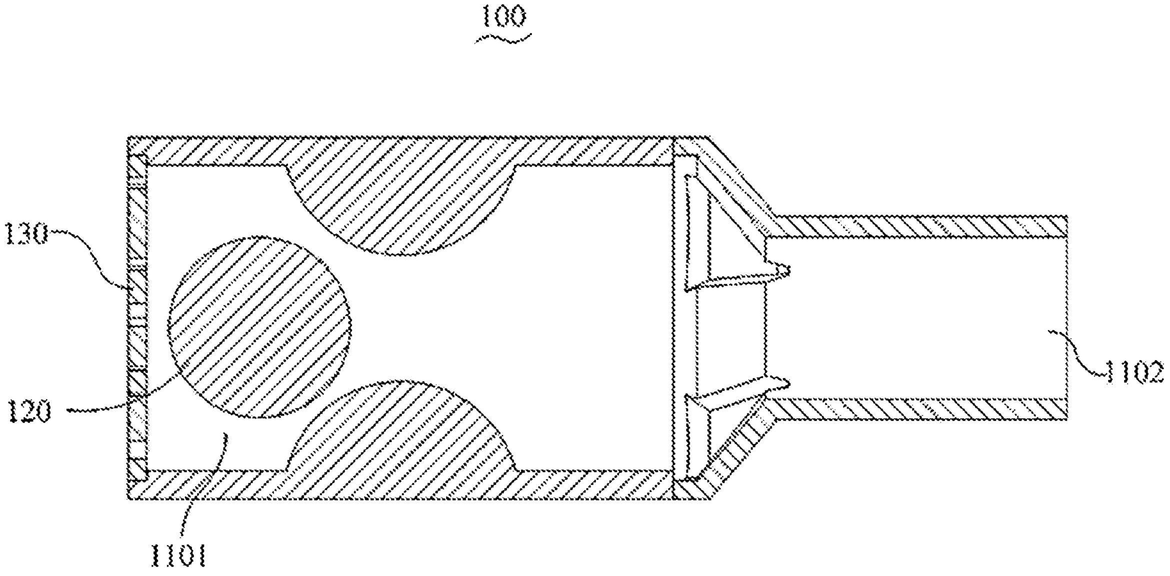
FIG. 2 is a cross-sectional view of a connector provided by an embodiment of the present application.

As shown in FIGS. 1 and 2, as an embodiment, the first pipe body 111 is connected to the second pipe body 112 by welding. In this embodiment, welding is used to connect the first pipe body 111 with the second pipe body 112. The welding has good airtightness, high structural rigidity, and simple and convenient operation, and the welding is used. Of course, in specific applications, it is not limited to welding only, for example, as an alternative, at least one of welding, bonding and threaded connection is used for connection.

Beneficial effects of the connector 100 provided by the embodiments of the present application are as below: the connector 100 includes a first connector body 110, a ball body 120 and a mesh baffle 130, where the first connector body 110 is provided with a hollow inner cavity 1101, and the mesh baffle 130 is provided with a plurality of first flowing through-holes 131, an annular protrusion part 1104 is provided inside the hollow inner cavity 1101, the annular protrusion part 1104 forms an annular through-hole 1112, and a diameter of the annular through-hole 1112 and a diameter of the first flowing through-hole 131 are both smaller than a diameter of the ball body 120, the ball body 120 is disposed in the hollow inner cavity 1101 and is limited by the annular protrusion part 1104 and the mesh baffle 130; when a fluid enters from a first inlet 1102, the ball body 120 is away from an annular through-hole 1112 under an action of a fluid pressure in the pipe wall of the first connector body 110 to form a passage, and when the fluid enters from an end close to the mesh baffle 130, the ball body 120 blocks the annular through-hole 1112 under the action of the fluid pressure in the pipe wall of the first connector body 110, thereby preventing splashing due to the fluid flowing back out of a water inlet and splashing when the connector 100 is disconnected.

As shown in FIG. 1 and FIGS. 4-7, an embodiment of the present application provides a connector assembly 200, including:

a first connector 210 that is the above-mentioned connector 100; and a second connector 220 that includes a third pipe body 221 and an elastic retaining ring 222 installed in the third pipe body 221, where the elastic retaining ring 222 is provided with a plurality of cutouts spaced circumferentially for dividing the elastic retaining ring 222 into a plurality of blades, an end of the first connector 210 away from the mesh baffle 130 is detachably connected to the second connector 220, and when the first connector 210 is connected to the second connector 220, the thimble part 1122 is inserted into the third pipe body 221 and opens the elastic retaining ring 222 to communicate the first connector 210 with the second connector 220; when the first connector 210 is disconnected to the second connector 220, the elastic retaining ring 222 in the third pipe body 221 is closed to block the first connector 210 from the second connector 220.

The elastic retaining ring 222 in this embodiment is formed by an elastic material and is in a circular shape to fit with a pipe of the third pipe body 221, the elastic retaining ring 222 is provided with a plurality of cutouts spaced circumferentially for dividing the elastic retaining ring 222 into a plurality of blades. When the first connector 210 is connected to the second connector 220, the plurality of blades of the elastic retaining ring 222 are deformed under an external force from the thimble part 1122 so that gaps of the cutouts become larger to achieve an opened passage; when the first connector 210 is disconnected to the second connector 220, the thimble part 1122 is away from the elastic retaining ring 222, and the plurality of blades of the elastic retaining ring 222 return to their original shape so that the gaps of the cutouts become smaller to achieve a closed passage. It should be noted that when the first connector 210 is disconnected to the second connector 220, the closure of the elastic retaining ring 222 can only prevent splashing of a fluid at the water outlet 312 when the connector is disconnected, but cannot prevent the fluid from penetrating out of the water inlet. The object of the present application is to prevent the liquid splashed out when the connector is disconnected from causing damage to a mining machine. Therefore, in the present application, it is only necessary to ensure that the fluid at the water outlet 312 will not splash out when the connector is disconnected, and then the object can be achieved.

Figure 5:
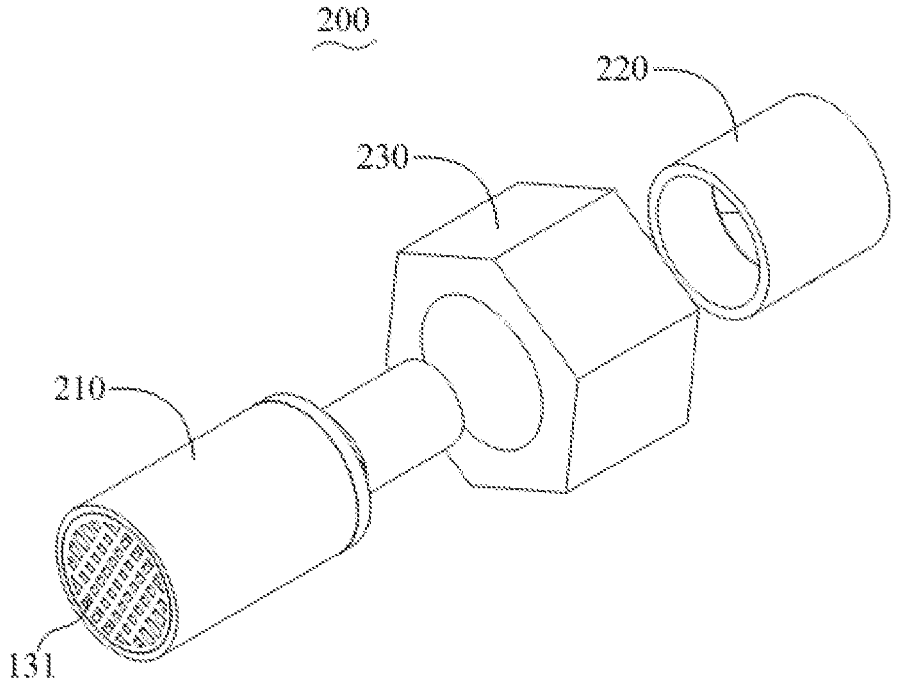
FIG. 5 is one exploded view of a connector assembly provided by an embodiment of the present application.
Figure 6:
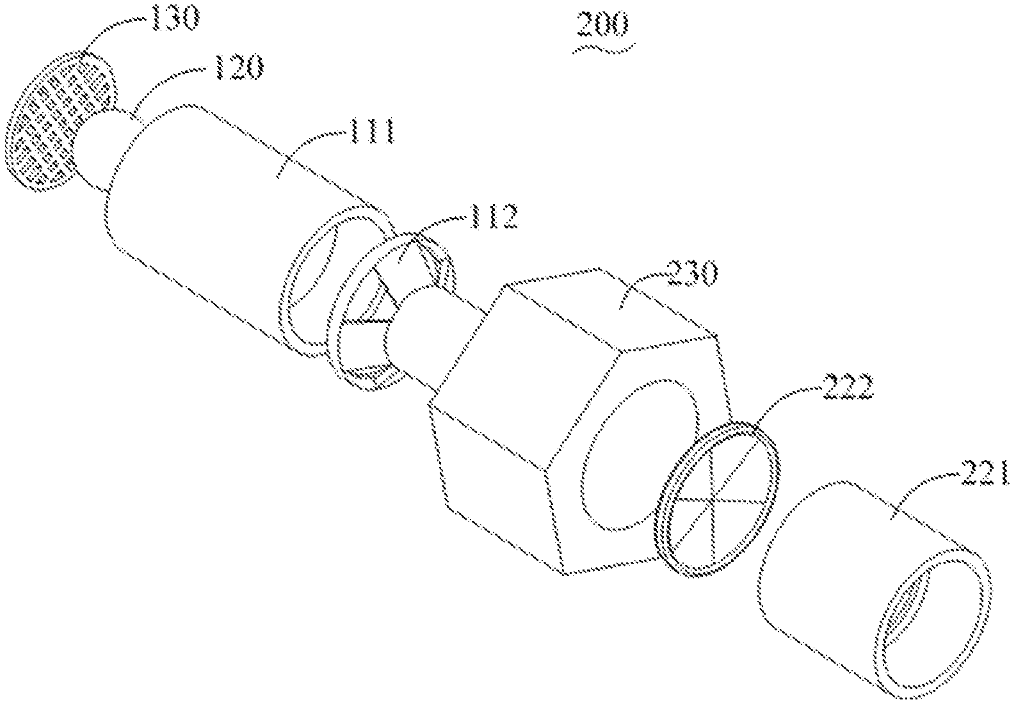
FIG. 6 is another exploded view of a connector assembly provided by an embodiment of the present application.

As shown in FIGS. 5 and 6, as an embodiment, the connector assembly 200 further includes a union nut 230, and the union nut 230 is configured to detachably connect the first connector 210 with the second connector 220. External threads adapted to the union nut 230 are provided at a position where the first connector 210 and the second connector 220 are connected with the union nut 230. The detachable connection is designed to facilitate the removal of an externally connected pipeline when needed.

Figure 7:
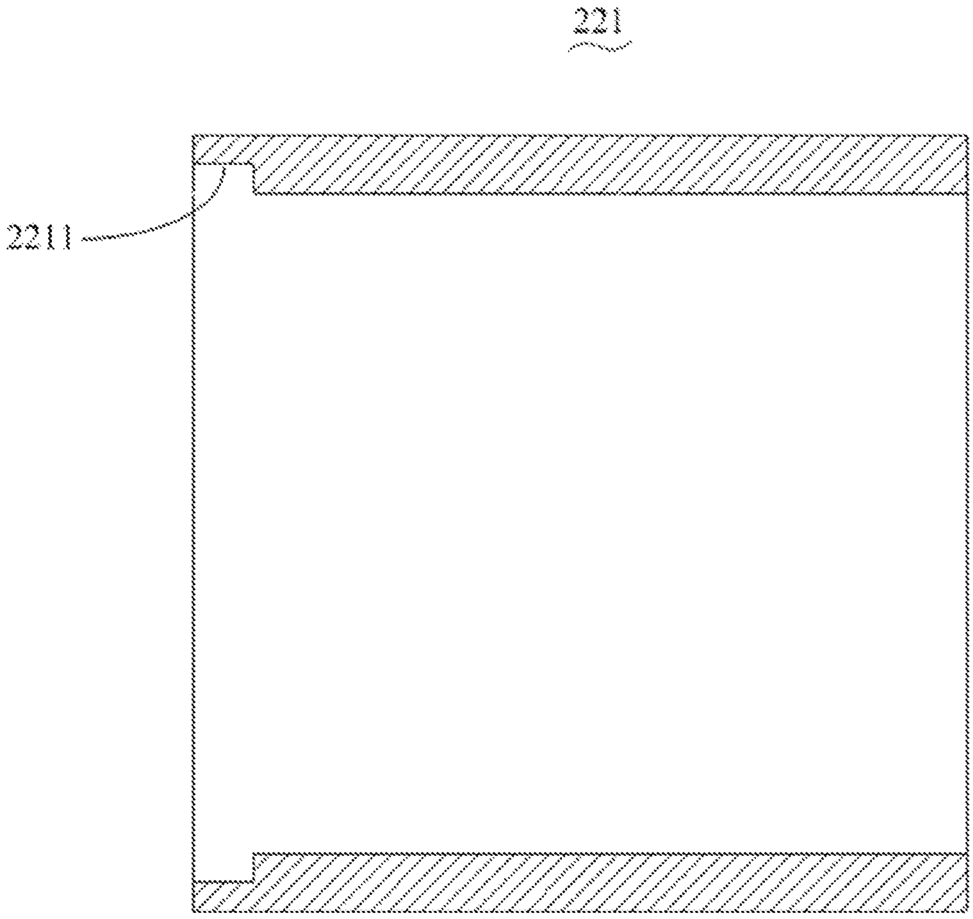
FIG. 7 is a cross-sectional view of a third pipe body provided by an embodiment of the present application.

As shown in FIGS. 6 and 7, as an embodiment, the third pipe body 221 is provided with a second notch 2211 for installing the elastic retaining ring 222. It should be noted that since the elastic retaining ring 222 is formed by a deformable elastic material and a diameter of the elastic retaining ring 222 is slightly smaller than a diameter of the second notch 2211, it can be ensured that the elastic retaining ring 222 can be placed into the second notch 2211, and in addition, the elastic retaining ring 222 is connected with the second notch 2211 by bonding.

Beneficial effects of the connector assembly 200 provided by the embodiments of the present application are as below: the connector assembly 200 includes a first connector 210 and a second connector 220, where the first connector 210 adopts the above-mentioned connector 100, and the second connector 220 includes an elastic retaining ring 222, the elastic retaining ring 222 is provided with a plurality of cutouts spaced circumferentially for dividing the elastic retaining ring 222 into a plurality of blades; when the first connector 210 is connected with the second connector 220, a thimble part 1122 is inserted into a third pipe body 221 and opens the elastic retaining ring 222 to communicate the first connector 210 with the second connector 220; and when the first connector 210 is disconnected with the second connector 220, the elastic retaining ring 222 is closed to block the first connector 210 from the second connector 220, thereby ensuring that when the first connector 210 is disconnected from the second connector 220, the fluid at both the first connector 210 and the second connector 220 will not splash.

Figure 8:
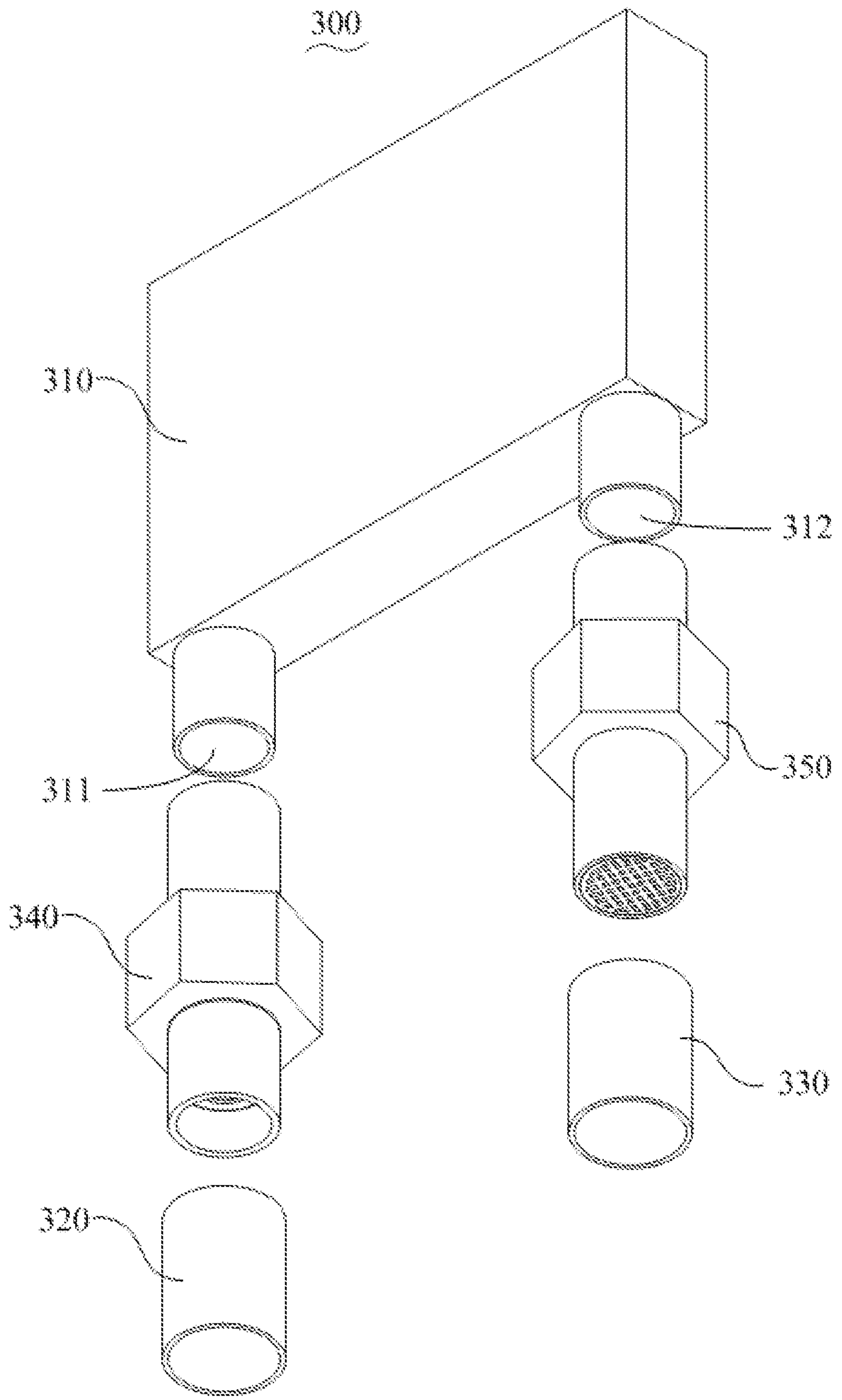
FIG. 8 is a perspective schematic view of a liquid cooled plate provided by an embodiment of the present application.
Figure 9:
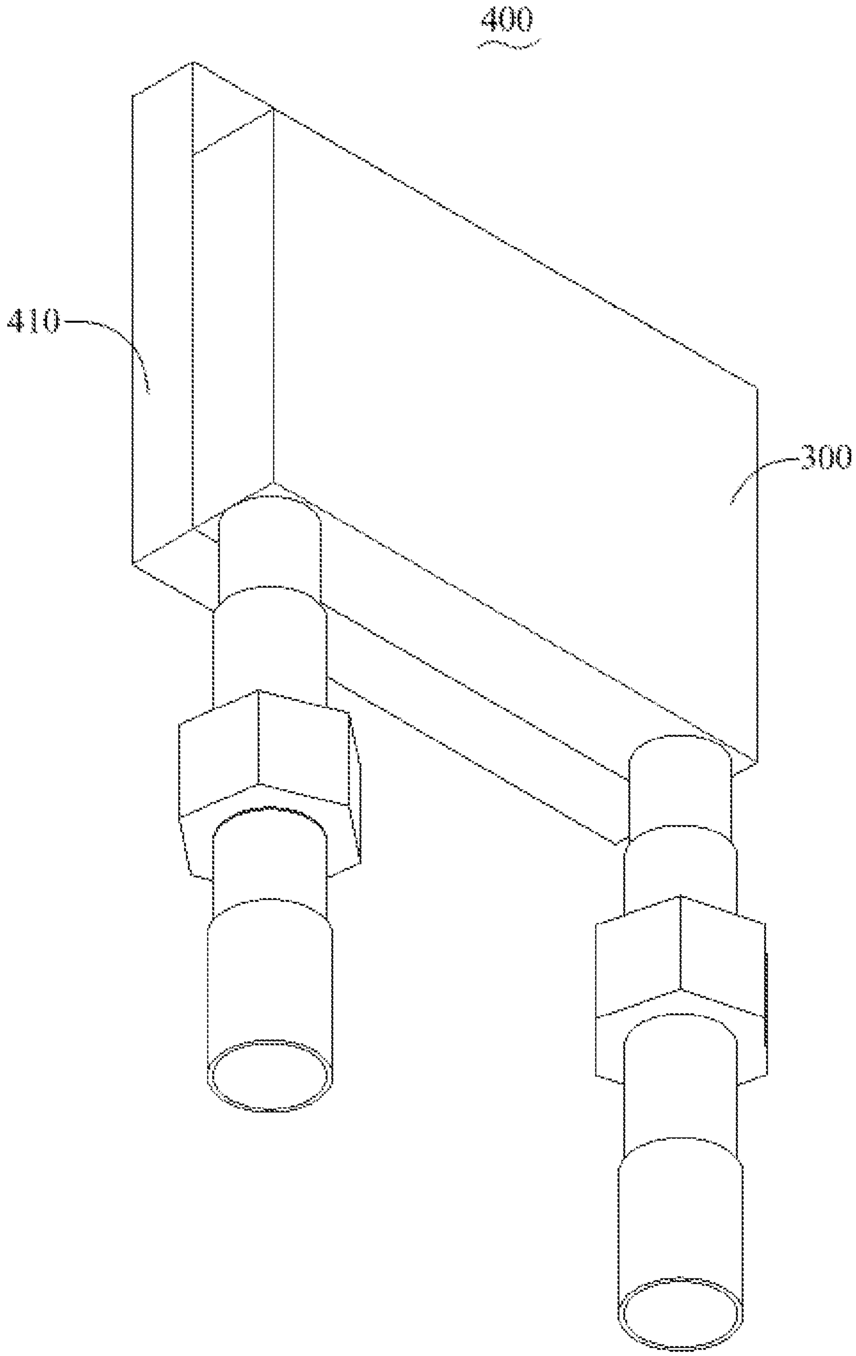
FIG. 9 is a perspective schematic view of a liquid cooled server provided by an embodiment of the present application.

As shown in FIG. 5 and FIG. 8, an embodiment of the present application provides a liquid cooled plate 300, including a liquid cooled plate body 310 and at least one above-mentioned connector assembly 200 connected to the liquid cooled plate body 310.

In specific applications, the liquid cooled plate 300 provided in this embodiment includes:

the liquid cooled plate body 310 that is provided with at least one water inlet 311 and at least one water outlet 312;

a water inlet pipe 320 that is configured to transport a fluid into the liquid cooled plate body 310;

a water outlet pipe 330 that is configured to transport the fluid in the liquid cooled plate body 310 to outside;

a first connector assembly 340 that adopts the above-mentioned connector assembly 200, where the first connector 210 of the first connector assembly 340 is connected to the water inlet 311 and the second connector 220 of the first connector assembly 340 is connected to the water inlet pipe 320;

a second connector assembly 350 where the second connector assembly 350 adopts the above-mentioned connector assembly 200; an end of the second connector 220 of the second connector assembly 350 is connected to the water outlet 312, and an end of the first connector 210 of the second connector assembly 350 is connected to the water outlet pipe 330.

It should be noted that both the first connector assembly 340 and the second connector assembly 350 are the above-mentioned connector assembly 200, with the difference being that the first connector assembly 340 is that an end close to the first connector 210 is connected to the water inlet 311, and the second connector assembly 350 is that an end close to the first connector 210 is connected to the water outlet 312, that is, the connector assemblies 200 connecting the water inlet 311 and the water outlet 312 have opposite directions; the liquid cooled plate body 310 provided in this embodiment is provided with one water inlet 311 and one water outlet 312, and correspondingly, the number of both the first connector assembly 340 and the water inlet pipe 320 is the same as the number of the water inlet 311, and the number of both the second connector assembly 350 and the water outlet pipe 330 is the same as the number of the water outlet 312. Of course, in specific applications, the number of the water inlet 311 and the water outlet 312 is not limited thereto. For example, as an alternative, two water inlets 311 and one water outlet 312 can also be provided, and correspondingly, the number of both the first connector assembly 340 and the inlet water pipe 320 is two, and the number of both the second connector assembly 350 and the water outlet pipe 330 is one.

As shown in FIG. 1, FIG. 5, FIG. 8 and FIG. 9, an embodiment of the present application provides a liquid cooled server 400, including a circuit board 410 and the above-mentioned liquid cooled plate 300, where the liquid cooled plate 300 is thermally conductively connected to the circuit board 410. The liquid cooled server 400 is also called a liquid-injection server, i.e., a server that takes away heat dissipated from the server through hot and cold exchange. In specific applications, the liquid cooled server 400 is applied to a mining machine, and the mining machine, which is a long-term high-intensity computer-type device mainly used for mining bitcoins, generally uses a combination of water-cooling and air-cooling. Therefore, the above-mentioned connector assembly 200 connected to the water inlet 311 and the water outlet 312 of the liquid cooled plate 300 can effectively prevent water from splashing out and splashing onto the mining machine when the connector 100 is disconnected, which can damage a main machine.

A working principle of the connector 100 is described below with reference to FIGS. 1-9:

The connector 100 is connected to the water inlet 311. When the connector 100 is connected, the fluid enters the connector 100 from the first inlet 1102, and the ball body 120 is away from the annular through-hole 1112 under an action of a fluid pressure in the pipe wall of the first connector body 110 to form an opened passage, the fluid flows smoothly in the pipe; when the connector 100 is disconnected, the fluid flows back toward the first inlet 1102, and at this time, the ball body 120 is affixed to the annular through-hole 1112 under the action of the fluid pressure in the pipe wall of the first connector body 110 to form a closed passage, thereby ensuring that the fluid in the water inlet 311 will not splash when the connector 100 is disconnected.

A working principle of the connector assembly 200 will be described below with reference to FIGS. 1-9: the first connector 210 is connected at the water inlet 311, and the second connector 220 is connected at the water outlet 312, where when the first connector 210 is connected to the second connector 220, the fluid enters the first connector 210 from the first inlet 1102, the ball body 120 is away from an annular through-hole 1112 under an action of a fluid pressure in the pipe wall of the first connector body 110 to form an opened passage, the thimble part 1122 of the first connector 210 is inserted into the third pipe body 221 and opens the elastic retaining ring 222 to enable the second connector 220 to form an opened passage, and the fluid flows smoothly in the pipe; and when the first connector 210 is disconnected to the second connector 220, the fluid at the first connector 210 flows back toward the direction of the first inlet 1102, and at this time, the ball body 120 is affixed to the annular through-hole 1112 under the action of the fluid pressure in the pipe wall of the first connector body 110 to form a closed passage, the elastic retaining ring 222 at the second connector 220 is closed due to loss of resistance from the thimble part 1122, to form a closed passage and block the fluid, thereby ensuring that the fluid in both the water inlet 311 and the water outlet 312 will not splash when the connector 100 is disconnected.

The above are only embodiments of the present application, and do not limit the patent scope of the present application. Under the application concept of the present application, equivalent structural transformations made based on the contents of the description and drawings of the present application, or direct/indirect applications to other relevant technical fields, are all included in the patent protection scope of the present application.

What is claimed is:

1. A connector, comprising a first connector body, a ball body and a mesh baffle, wherein the first connector body is provided with a hollow inner cavity, a first inlet disposed at one end of the hollow inner cavity, and a first outlet disposed at the other end of the hollow inner cavity; the mesh baffle is disposed in the hollow inner cavity, and the mesh baffle is provided with a plurality of first flowing through-holes, an annular protrusion part located between the first inlet and the mesh baffle is provided inside the hollow inner cavity, the annular protrusion part is enclosed to form an annular through-hole, a diameter of the annular through-hole and a diameter of the first flowing through-hole are both smaller than a diameter of the ball body; and the ball body is disposed between the annular protrusion part and the mesh baffle;

wherein the first connector body comprises a first pipe body and a second pipe body connected to the first pipe body; the second pipe body comprises a connection part and a thimble part, one end of the connection part is connected to an end of the first pipe body away from the mesh baffle, and the other end of the connection part is connected to the thimble part, the thimble part is configured to be inserted into a second connector and opens an elastic retaining ring of the second connector; the first inlet is disposed at an end of the first pipe body close to the second pipe body, and the first outlet is disposed at an end of the first pipe body away from the second pipe body.

2. The connector according to claim 1, wherein the connection part comprises a first connection part and a second connection part, the first connection part is connected to the end of the first pipe body away from the mesh baffle, the second connection part is configured to connect the first connection part with the thimble part.

3. The connector according to claim 2, wherein the second connection part is in a cone-shape, and the second connection part comprises a first end part connected to the first connection part, a second end part connected to the thimble part and having a diameter smaller than a diameter of the first end part, and a cone-shape side part for connecting the first end part to the second end part, wherein at least one second flowing through-hole is opened on the cone-shape side part and is configured for fluid to pass through.

4. The connector according to claim 1, wherein the end of the first pipe body away from the second pipe body is provided with a first notch for installing the mesh baffle.

5. The connector according to claim 1, wherein the first pipe body is connected to the second pipe body in at least one manner of welding, bonding and threaded connection.

6. A connector assembly, comprising:

a first connector that adopts the connector according to claim 1; and a second connector comprising a third pipe body and an elastic retaining ring installed within the third pipe body, wherein the elastic retaining ring is provided with a plurality of cutouts spaced circumferentially for dividing the elastic retaining ring into a plurality of blades, an end of the first connector away from the mesh baffle is detachably connected to the second connector, and when the first connector is connected to the second connector, a thimble part is inserted into the third pipe body to open the elastic retaining ring so as to communicate the first connector with the second connector; and when the first connector is disconnected to the second connector, the elastic retaining ring in the third pipe body is closed to block the first connector from the second connector.

7. The connector assembly according to claim 6, wherein the connector assembly further comprises a union nut, and the union nut is configured to detachably connect the first connector with the second connector.

8. The connector assembly according to claim 6, wherein the third pipe body is provided with a second notch for installing the elastic retaining ring.

9. The connector assembly according to claim 6, wherein the first connector body comprises a first pipe body and a second pipe body connected to the first pipe body; the second pipe body comprises a connection part and the thimble part, one end of the connection part is connected to an end of the first pipe body away from the mesh baffle, and the other end of the connection part is connected to the thimble part, the thimble part is configured to be inserted into the second connector and opens the elastic retaining ring of the second connector; the first inlet is disposed at an end of the first pipe body close to the second pipe body, and the first outlet is disposed at an end of the first pipe body away from the second pipe body.

10. The connector assembly according to claim 9, wherein the connection part comprises a first connection part and a second connection part, the first connection part is connected to the end of the first pipe body away from the mesh baffle, the second connection part is configured to connect the first connection part with the thimble part.

11. The connector assembly according to claim 10, wherein the second connection part is in a cone-shape, and the second connection part comprises a first end part connected to the first connection part, a second end part connected to the thimble part and having a diameter smaller than a diameter of the first end part, and a cone-shape side part for connecting the first end part to the second end part, wherein at least one second flowing through-hole is opened on the cone-shape side part and is configured for fluid to pass through.

12. The connector assembly according to claim 9, wherein the end of the first pipe body away from the second pipe body is provided with a first notch for installing the mesh baffle.

13. The connector assembly according to claim 9, wherein the first pipe body is connected to the second pipe body in at least one manner of welding, bonding and threaded connection.

14. A liquid cooled plate, comprising: a liquid cooled plate body and at least one connector assembly according to claim 6 connected to the liquid cooled plate body.

15. The liquid cooled plate according to claim 14, wherein the first connector body comprises a first pipe body and a second pipe body connected to the first pipe body; the second pipe body comprises a connection part and the thimble part, one end of the connection part is connected to an end of the first pipe body away from the mesh baffle, and the other end of the connection part is connected to the thimble part, the thimble part is configured to be inserted into the second connector and opens the elastic retaining ring of the second connector; the first inlet is disposed at an end of the first pipe body close to the second pipe body, and the first outlet is disposed at an end of the first pipe body away from the second pipe body.

16. The liquid cooled plate according to claim 15, wherein the connection part comprises a first connection part and a second connection part, the first connection part is connected to the end of the first pipe body away from the mesh baffle, the second connection part is configured to connect the first connection part with the thimble part.

17. The liquid cooled plate according to claim 16, wherein the second connection part is in a cone-shape, and the second connection part comprises a first end part connected to the first connection part, a second end part connected to the thimble part and having a diameter smaller than a diameter of the first end part, and a cone-shape side part for connecting the first end part to the second end part, wherein at least one second flowing through-hole is opened on the cone-shape side part and is configured for fluid to pass through.

18. The liquid cooled plate according to claim 15, wherein the end of the first pipe body away from the second pipe body is provided with a first notch for installing the mesh baffle.

19. A liquid cooled server, comprising: a circuit board and the liquid cooled plate according to claim 14, wherein the liquid cooled plate is thermally conductively connected to the circuit board.

* * * * *